United States Patent
Zhao et al.

(10) Patent No.: US 11,401,019 B2
(45) Date of Patent: Aug. 2, 2022

(54) SIMULATION METHOD FOR TWO-STAGE PLUNGER PRESSURIZED COMMON RAIL FUEL SYSTEM OF MARINE LOW-SPEED ENGINE

(71) Applicant: HARBIN ENGINEERING UNIVERSITY, Harbin (CN)

(72) Inventors: Jianhui Zhao, Harbin (CN); Xiangdong Lu, Harbin (CN)

(73) Assignee: HARBIN ENGINEERING UNIVERSITY, Harbin (CN)

( * ) Notice: Subject to any disclaimer, the term of this patent is extended or adjusted under 35 U.S.C. 154(b) by 106 days.

(21) Appl. No.: 17/038,990

(22) Filed: Sep. 30, 2020

(65) Prior Publication Data

US 2021/0197942 A1 Jul. 1, 2021

(51) Int. Cl.
| | |
|---|---|
| *B63H 20/10* | (2006.01) |
| *G06N 7/00* | (2006.01) |
| *F02B 61/04* | (2006.01) |
| *B63H 20/00* | (2006.01) |

(52) U.S. Cl.
CPC ........... *B63H 20/10* (2013.01); *B63H 20/001* (2013.01); *F02B 61/045* (2013.01); *G06N 7/00* (2013.01)

(58) Field of Classification Search
CPC ..... B63H 20/10; B63H 20/001; F02B 61/045; G06N 7/00
See application file for complete search history.

(56) References Cited

U.S. PATENT DOCUMENTS

| | | | | |
|---|---|---|---|---|
| 5,709,341 A | * | 1/1998 | Graves | F02M 45/063 239/127 |
| 2010/0005872 A1 | * | 1/2010 | Vennettilli | F02D 41/18 73/114.73 |

FOREIGN PATENT DOCUMENTS

EP 2669172 A1 * 12/2013 ............. B63B 9/001

\* cited by examiner

*Primary Examiner* — Stephen P Avila
(74) *Attorney, Agent, or Firm* — Nolte Lackenbach Siegel

(57) ABSTRACT

An objective of the disclosure is to provide a simulation method for a two-stage plunger pressurized common rail fuel system of a marine low-speed engine. The method includes: first setting initial status parameters, such as a control step of a system model, a total time of a calculation process, and structure parameters and pressures of components; and then establishing a mathematical model of a fuel booster unit, a mathematical model of a high-pressure fuel pipe and a mathematical model of a fuel injector based on a MATLAB simulation platform, and connecting input and output parameters of the models to realize data transfer between the models. By considering one-dimensional (1D) spatial fluctuations in the high-pressure fuel pipe, the disclosure establishes a high-precision model of the fuel system, which provides an effective method for designing and calculating detailed pressures in the common rail fuel system.

4 Claims, 2 Drawing Sheets

SIMULATION METHOD FOR TWO-STAGE PLUNGER PRESSURIZED COMMON RAIL FUEL SYSTEM OF MARINE LOW-SPEED ENGINE

CROSS REFERENCE TO RELATED APPLICATION

This application claims the priority of Chinese Patent Application No. CN20191138824.6, entitled "Simulation Method for Two-Stage Plunger Pressurized Common Rail Fuel System of Marine Low-Speed Engine" filed with the China National Intellectual Property Administration on Dec. 30, 2019, which is incorporated herein by reference in its entirety.

TECHNICAL FIELD

The disclosure relates to a simulation method for a diesel engine, in particular to a simulation method for a marine diesel engine.

BACKGROUND

Marine low-speed diesel engine has the advantages of high power and high thermal efficiency, and has become the main propulsion power unit of large ocean-going ships.

After the end of the 20$^{th}$ century, countries around the world have gradually increased their requirements for the emissions and performance indicators of the internal combustion engine (ICE). In order to improve the emissions indicators of the ICE, research and development of electronically controlled fuel injection systems have become an inevitable trend. The design of the low-speed engine is a comprehensive subject covering multiple systems and multiple disciplines. The working process of the low-speed engine's fuel system is a multi-physics coupling process, in which different physical fields affect each other and jointly determine the stability of the working process. The use of the computer integrated simulation technology to establish a mathematical model to conduct multi-angle research on the system performance is the focus of current research.

SUMMARY

An objective of the disclosure is to provide a simulation method for a two-stage plunger pressurized common rail fuel system of a marine low-speed engine. This method is designed to conduct multi-angle and multi-disciplinary simulation analysis.

The objective of the disclosure is achieved as follows:

A simulation method for a two-stage plunger pressurized common rail fuel system of a marine low-speed engine, including:

(1) setting initial parameters, such as a control step $N_t$ of the system, a total time $N_T$ ($0<N_t\leq N_T$) of a calculation process, and structure parameters and pressures of a booster unit, a high-pressure fuel pipe and a fuel injector;

(2) establishing a mathematical model of the fuel system, including a mathematical model of the fuel booster unit, a mathematical model of the high-pressure fuel pipe and a mathematical model of the fuel injector; and (3) connecting input and output parameters of the established models to realize data transfer between the models: calculating real-time pressure changes and pressures of fuel flowing through each part of the fuel system in one step $N_t$, and obtaining an injection pressure at this step; performing an iterative calculation on the fuel system model in $N_T/N_t$ steps based on the status parameters in a previous step, to obtain injection pressure data for an entire working process of the fuel system.

The disclosure may further include:

1. In step (1), the initial parameters that need to be set include:

a control step $N_t$ of the system, a total time $N_T$ ($0<N_t\leq N_T$) of a calculation process, a common rail servo oil pressure $P_s$, diameters $D_1$ and $D_2$ of large and small plungers in the booster unit, a volume $V_y$ of a fuel booster chamber, a length $L$ and diameter $d_{hp}$ of the high-pressure fuel pipe, and a volume $V_f$ of a fuel sump and a volume $V_{in}$ of a pressure chamber in the fuel injector.

2. In step (2), the established mathematical model of the fuel system includes a mathematical model of the fuel booster unit, a mathematical model of the high-pressure fuel pipe and a mathematical model of the fuel injector:

(a) the mathematical model of the fuel booster unit is specifically established as follows:

setting an electromagnetic signal I to drive a two-position three-way solenoid valve in the fuel booster unit to switch between open and close states to boost the low-pressure fuel;

where, after boosting, a fuel pressure changes to $$\Delta P_y = \left(\frac{E}{V_y \pm \Delta V_y}\right)\left(\frac{d\Delta V_y}{dt} - Q_{out}\right)$$

where, $\Delta V_z$ is a volume change of the fuel booster chamber, and $Q_{out}$ is a flow rate of fuel flowing into the high-pressure fuel pipe;

(b) by considering one-dimensional (1D) fluctuations in the high-pressure fuel pipe, the mathematical model of the high-pressure fuel pipe is specifically established as follows:

dividing a flow in the high-pressure fuel pipe according to a spatial length into sections for solving, to obtain: a forward pressure fluctuation in one control step $N_t$ in the length of L from a length of $\Delta L$:

$$F = \begin{bmatrix} F(0) \\ F(\Delta L) \\ F(\Delta L + \Delta L) \\ \vdots \\ F(L) \end{bmatrix};$$

a reverse pressure fluctuation from the current length of $\Delta L$:

$$R = \begin{bmatrix} R(L) \\ R(L - \Delta L) \\ \vdots \\ R(\Delta L) \\ R(0) \end{bmatrix};$$

forward and reverse pressure fluctuations in $N_T/N_t$ steps from $N_t$:

$$Fnd(L^*+\Delta L)=F(L^*)\cdot e^{-KN_t}, \quad \text{and} \quad Rnd(L^*+\Delta L)=R(L^*)\cdot e^{-KN_t};$$

where, K is a dissipation factor; and obtaining flow rates at an inlet and an outlet of the high-pressure fuel pipe as follows:

$$v(0)=[F(0)+R(0)]/(\alpha\rho), \text{ and } v(L)=[F(L)+R(L)]/(\alpha\rho);$$

(c) the mathematical model of the fuel injector is specifically established as follows:

calculating a fuel pressure change in the fuel sump as follows:

$$\Delta P_f = \left(\frac{E}{V_f \pm \Delta V_f}\right)\left(Q_{in} - Q_{out} + \frac{d\Delta V_f}{dt}\right);$$

where, $\Delta V_f$ is a volume change of the fuel sump, $Q_{in}$ is a flow rate of fuel flowing from the high-pressure fuel pipe into the fuel sump, and $Q_{out}$ is a flow rate of fuel flowing into the pressure chamber;

calculating a fuel pressure change in the pressure chamber as follows:

$$\Delta P_{in} = \left(\frac{E}{V_{in}}\right)(Q_{in} - Q_{out});$$

where, $Q_{in}$ is a flow rate of fuel flowing from the fuel sump into the pressure chamber, and $Q_{out}$ is a flow rate of fuel injected from a nozzle;

$$Q_{in} = 1/2\sqrt{\frac{2(P_f - P_{in})}{\rho}} \cdot \mu \cdot A_{in}$$

where, $A_{in}$ is a flow area from the fuel sump to the pressure chamber;

$$Q_{out} = 1/2\sqrt{\frac{2(P_{in} - P_0)}{\rho}} \cdot \mu \cdot A_*$$

where, $P_0$ is an in-cylinder pressure, and $A^*$ is a total area of the nozzle.

3. In step (3), the connecting input and output parameters of the established models to realize data transfer between the models specifically includes:

applying $$Q_{out} = v(0) \cdot \frac{\pi \cdot d_{hp}^2}{4}$$

to calculate a fuel pressure change $\Delta P_y$, to obtain a real-time fuel pressure in the booster chamber:

$$P_y = P_{y0} + \Delta P_y;$$

applying $$Q_{in} = v(L) \cdot \frac{\pi \cdot d_{hp}^2}{4}$$

to calculate a fuel pressure change $\Delta P_f$, to obtain a real-time fuel pressure in the fuel sump:

$$P_f = P_{f0} + \Delta P_f;$$

calculating real-time pressure changes and pressures of fuel flowing through each part of the fuel system in one step $N_t$, and obtaining an injection pressure at this step; performing an iterative calculation on the fuel system model in $N_T/N_t$ steps based on the status parameters in a previous step, to obtain injection pressure data for an entire working process of the fuel system.

The disclosure has the following advantages. The disclosure provides a modeling and simulation method for a two-stage plunger pressurized common rail fuel system of a marine low-speed engine. The method of the disclosure establishes a high-precision model of the fuel system by using MATLAB simulation software. This method considers one-dimensional (1D) spatial fluctuations in the high-pressure fuel pipe, and can be used to optimize and verify the design of the common rail fuel system. In addition, this method has accurate calculation results, good practicability, and is applicable to engine models.

DETAILED DESCRIPTION

The disclosure is described in detail below with reference to the accompanying drawings and examples.

Figure 1:
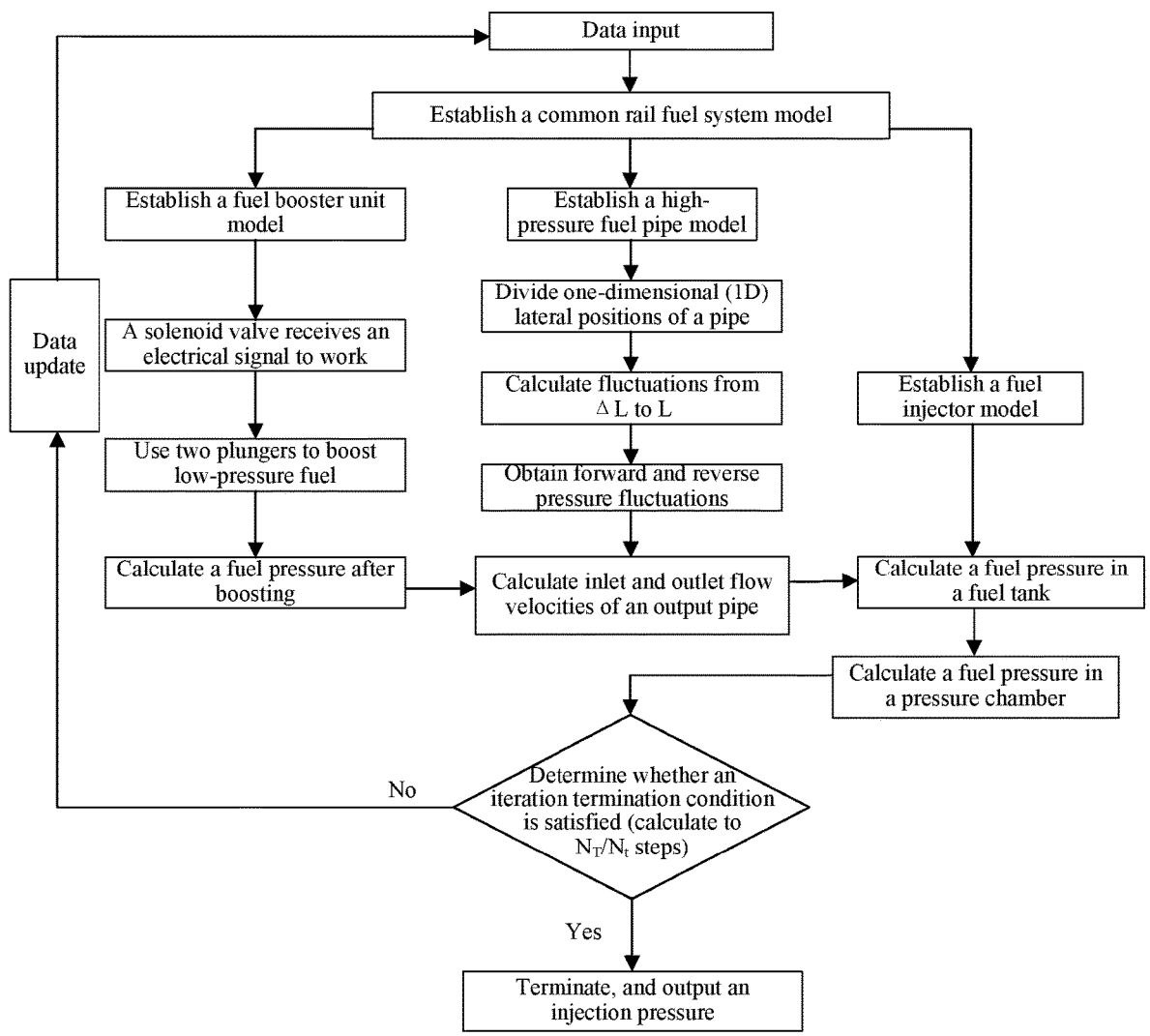
FIG. 1 is a flowchart of the disclosure.
Figure 2:
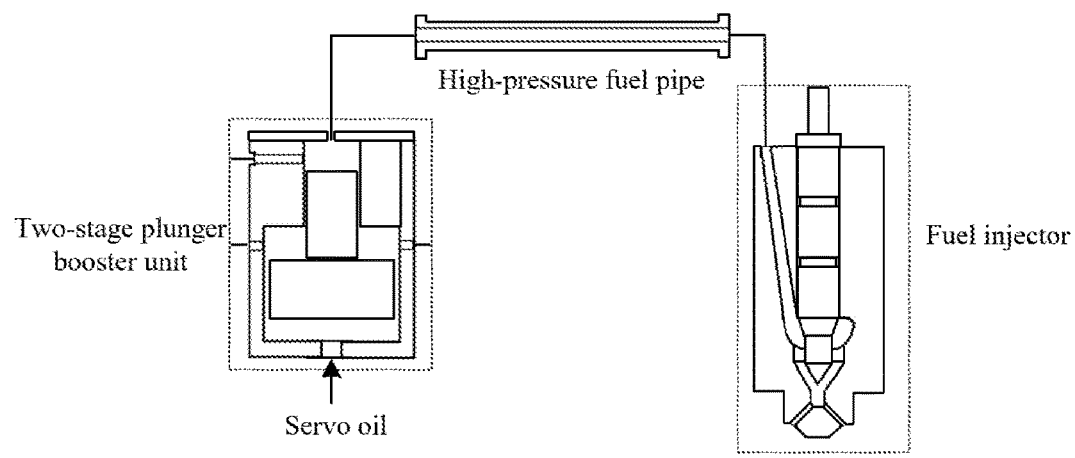
FIG. 2 is a structural diagram of a fuel system.
Figure 3:
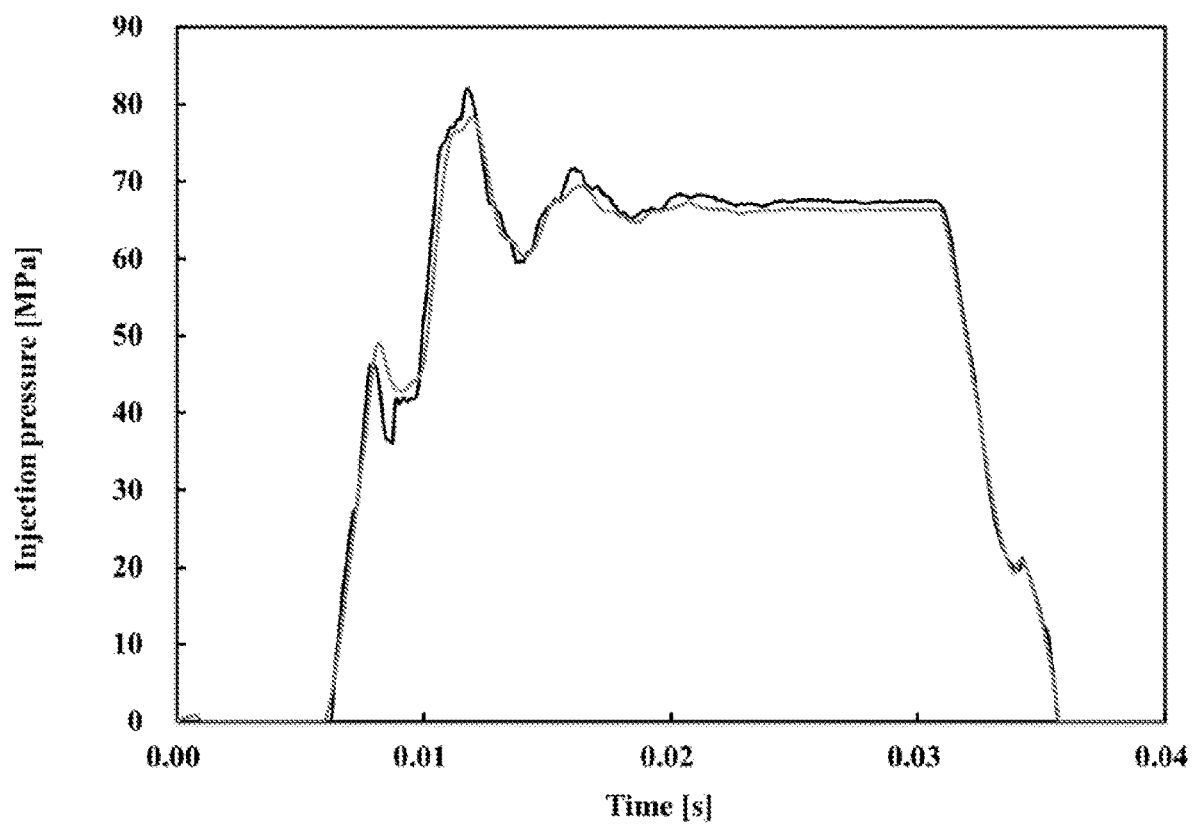
FIG. 3 shows a comparison of simulation and experimental results of an injection pressure of the fuel system.

As shown in FIGS. 1 to 3, the disclosure provides a modeling and simulation method for a two-stage plunger pressurized common rail fuel system of a marine low-speed engine. According to the overall flowchart as shown in FIG. 1, the method specifically includes the following steps:

Step 1, set initial parameters of a system model, including:

a control step $N_t$ of the system, a total time $N_T$ ($0<N_t \leq N_T$) of a calculation process, a common rail servo oil pressure $P_s$, diameters $D_1$ and $D_2$ of large and small plungers in the booster unit, a volume $V_y$ of a fuel booster chamber, a length L and diameter $d_{hp}$ of the high-pressure fuel pipe, a volume $V_f$ of a fuel sump and a volume $V_{in}$ of a pressure chamber in the fuel injector, a parameter of a needle valve component, and other related parameters.

Step 2: establish a mathematical model of the fuel system, including a mathematical model of the fuel booster unit, a mathematical model of the high-pressure fuel pipe and a mathematical model of the fuel injector, where (a) the mathematical model of the fuel booster unit is specifically established as follows:

set an electromagnetic signal I to drive a two-position three-way solenoid valve in the fuel booster unit to switch between open and close states to boost the low-pressure fuel;

where, after boosting, a fuel pressure changes to $$\Delta P_y = \left(\frac{E}{V_y \pm \Delta V_y}\right)\left(\frac{d\Delta V_y}{dt} - Q_{out}\right) \quad (1)$$

where, $\Delta V_z$ is a volume change of the fuel booster chamber, and $Q_{out}$ is a flow rate of fuel flowing into the high-pressure fuel pipe;
$\Delta V_z = S_2 \cdot H$, where, H is obtained according to a mechanical motion equation of the plunger;

(b) by considering one-dimensional (1D) fluctuations in the high-pressure fuel pipe, the mathematical model of the high-pressure fuel pipe is specifically established as follows:

divide a flow in the high-pressure fuel pipe according to a spatial length into sections for solving, to obtain: a forward pressure fluctuation in one control step $N_t$ in the length of L from a length of $\Delta L$:

$$F = \begin{bmatrix} F(0) \\ F(\Delta L) \\ F(\Delta L + \Delta L) \\ \vdots \\ F(L) \end{bmatrix} \quad (2)$$

a reverse pressure fluctuation from the current length of $\Delta L$:

$$R = \begin{bmatrix} R(L) \\ R(L + \Delta L) \\ \vdots \\ R(\Delta L) \\ R(0) \end{bmatrix} \quad (3)$$

forward and reverse pressure fluctuations in $N_T/N_t$ steps from $N_t$:

$$Fnd(L^* + \Delta L) = F(L^*) \cdot e^{-KN_t}, \quad \text{and} \quad Rnd(L^* + \Delta L) = R(L^*) \cdot e^{-KN_t} \quad (4)$$

where, K is a dissipation factor, which is specifically calculated as follows:

assume that the flow in the pipe is a turbulent flow, and calculate a Reynolds number based on a current average flow velocity in the pipe according to the following formula:

$$Re = \frac{\bar{V} d_{hp}}{v} \quad (5)$$

where, $\bar{V}$ is the average flow velocity in the pipe, and $v$ is a kinematic viscosity;

calculate a resistance coefficient $\lambda$ of the fuel pipe according to a semi-empirical formula of the target fuel pipe, after obtaining the current Reynolds number; and obtain the dissipation factor according to $$K = \lambda \frac{\bar{V}}{2 d_{hp}}; \quad (6)$$

obtain flow rates at an inlet and an outlet of the high-pressure fuel pipe as follows:

$$v(0) = [F(0) + R(0)]/(\alpha \rho), \text{ and } v(L) = [F(L) + R(L)]/(\alpha \rho) \quad (7);$$

where, $\alpha$ is a speed of sound, and $\rho$ is a fuel density;

(c) the mathematical model of the fuel injector is specifically established as follows:

calculate a fuel pressure change in the fuel sump as follows:

$$\Delta P_f = \left(\frac{E}{V_f \pm \Delta V_f}\right)\left(Q_{in} - Q_{out} + \frac{d\Delta V_f}{dt}\right) \quad (8)$$

where, $\Delta V_f$ is a volume change of the fuel sump, $Q_{in}$ is a flow rate of fuel flowing from the high-pressure fuel pipe into the fuel sump, and $Q_{out}$ is a flow rate of fuel flowing into the pressure chamber;

calculate a fuel pressure change in the pressure chamber as follows:

$$\Delta P_{in} = \left(\frac{E}{V_{in}}\right)(Q_{in} - Q_{out}) \quad (9)$$

where, $Q_{in}$ is a flow rate of fuel flowing from the fuel sump into the pressure chamber, and $Q_{out}$ is a flow rate of fuel injected from a nozzle;

$$Q_{in} = 1/2 \sqrt{\frac{2(P_f - P_{in})}{\rho}} \cdot \mu \cdot A_{in} \quad (10)$$

where, $A_{in}$ is a flow area from the fuel sump to the pressure chamber;

$$Q_{out} = 1/2 \sqrt{\frac{2(P_{in} - P_0)}{\rho}} \cdot \mu \cdot A_* \quad (11)$$

where, $P_0$ is an in-cylinder pressure, and $A^*$ is a total area of the nozzle.

Step 3: connect input and output parameters of the established models to realize data transfer between the models:

apply $$Q_{out} = v(0) \cdot \frac{\pi \cdot d_{hp}^2}{4}$$

to calculate a fuel pressure change $\Delta P_y$, to obtain a real-time fuel pressure in the booster chamber:

$$P_y = P_{y0} + \Delta P_y \quad (12)$$

apply $$Q_{in} = v(L) \cdot \frac{\pi \cdot d_{hp}^2}{4}$$

to calculate a fuel pressure change $\Delta P_f$, to obtain a real-time fuel pressure in the fuel sump:

$$P_f = P_{f0} + \Delta P_f \quad (13)$$

calculating real-time pressure changes and pressures of fuel flowing through each part of the fuel system in one step $N_t$, and obtaining an injection pressure at this step; performing an iterative calculation on the fuel system model in $N_T/N_t$ steps based on the status parameters in a previous step, to obtain injection pressure data for an entire working process of the fuel system.

Assuming j is a number of iterations, then an injection pressure is as follows:

$$P_{in}(j+1)=P_{in}(j)+\Delta P_{in} \quad (14)$$

FIG. 3 shows a comparison of simulation and experimental results of the injection pressure of the fuel system, which indicates that the pressure fluctuations have good consistency.

What is claimed is:

1. A simulation method for a two-stage plunger pressurized common rail fuel system of a marine low-speed engine, comprising the following steps:
    (1) setting initial parameters, such as a control step $N_t$ of the system, a total time $N_T$ ($0<N_t \le N_T$) of a calculation process, and structure parameters and pressures of a booster unit, a high-pressure fuel pipe and a fuel injector;
    (2) establishing a mathematical model of the fuel system, comprising a mathematical model of a fuel booster unit, a mathematical model of a high-pressure fuel pipe and a mathematical model of a fuel injector; and
    (3) connecting input and output parameters of the established models to realize data transfer between the established models: calculating real-time pressure changes and pressures of fuel flowing through each part of the fuel system in one step $N_t$, and obtaining an injection pressure at this step; performing an iterative calculation on the fuel system model in $N_T/N_t$ steps based on the status parameters in a previous step, to obtain injection pressure data for an entire working process of the fuel system.

2. The simulation method for a two-stage plunger pressurized common rail fuel system of a marine low-speed engine according to claim 1, wherein in step (1), the initial parameters that need to be set comprise:
    a control step $N_t$ of the system, a total time $N_T$ ($0<N_t \le N_T$) of a calculation process, a common rail servo oil pressure $P_s$, diameters $D_1$ and $D_2$ of large and small plungers in the booster unit, a volume $V_y$ of a fuel booster chamber, a length L and diameter $d_{hp}$ of the high-pressure fuel pipe, and a volume $V_f$ of a fuel sump and a volume $V_{in}$ of a pressure chamber in the fuel injector.

3. The simulation method for a two-stage plunger pressurized common rail fuel system of a marine low-speed engine according to claim 1, wherein in step (2), the established mathematical model of the fuel system comprises a mathematical model of the fuel booster unit, a mathematical model of the high-pressure fuel pipe and a mathematical model of the fuel injector:
    (a) the mathematical model of the fuel booster unit is specifically established as follows:
    setting an electromagnetic signal I to drive a two-position three-way solenoid valve in the fuel booster unit to switch between open and close states to boost the low-pressure fuel;
    wherein, after boosting, a fuel pressure changes to $$\Delta P_y = \left(\frac{E}{V_y \pm \Delta V_y}\right)\left(\frac{d\Delta V_y}{dt} - Q_{out}\right)$$

wherein, $\Delta V_z$ is a volume change of the fuel booster chamber, and $Q_{out}$ is a flow rate of fuel flowing into the high-pressure fuel pipe;
    (b) by considering one-dimensional (1D) fluctuations in a high-pressure fuel pipe, the mathematical model of the high-pressure fuel pipe is specifically established as follows:
    dividing a flow in the high-pressure fuel pipe according to a spatial length into sections for solving, to obtain: a forward pressure fluctuation in one control step $N_t$ in the length of L from a length of $\Delta L$:

$$F = \begin{bmatrix} F(0) \\ F(\Delta L) \\ F(\Delta L + \Delta L) \\ \vdots \\ F(L) \end{bmatrix};$$

a reverse pressure fluctuation from the current length of $\Delta L$:

$$R = \begin{bmatrix} R(L) \\ R(L - \Delta L) \\ \vdots \\ R(\Delta L) \\ R(0) \end{bmatrix};$$

forward and reverse pressure fluctuations in $N_T/N_t$ steps from $N_t$:

$$Fnd(L^*+\Delta L)=F(L^*) \cdot e^{-KN_t}, \quad \text{and} \quad Rnd(L^*+\Delta L)= R(L^*) \cdot e^{-KN_t};$$

wherein, K is a dissipation factor; and
obtaining flow rates at an inlet and an outlet of the high-pressure fuel pipe as follows:

$$v(0)=[F(0)+R(0)]/(\alpha\rho), \text{ and } v(L)=[F(L)+R(L)]/(\alpha\rho);$$

(c) the mathematical model of the fuel injector is specifically established as follows:
calculating a fuel pressure change in the fuel sump as follows:

$$\Delta P_f = \left(\frac{E}{V_f \pm \Delta V_f}\right)\left(Q_{in} - Q_{out}\frac{d\Delta V_f}{dt}\right);$$

wherein, $\Delta V_f$ is a volume change of the fuel sump, $Q_{in}$ is a flow rate of fuel flowing from the high-pressure fuel pipe into the fuel sump, and $Q_{out}$ is a flow rate of fuel flowing into the pressure chamber;
calculating a fuel pressure change in the pressure chamber as follows:

$$\Delta P_{in} = \left(\frac{E}{V_{in}}\right)(Q_{in} - Q_{out});$$

wherein, $Q_{in}$ is a flow rate of fuel flowing from the fuel sump into the pressure chamber, and $Q_{out}$ is a flow rate of fuel injected from a nozzle;

$$Q_{in} = 1/2\sqrt{\frac{2(P_f - P_{in})}{\rho}} \cdot \mu \cdot A_{in},$$

wherein, $A_{in}$ is a flow area from the fuel sump to the pressure chamber;

$$Q_{out} = 1/2\sqrt{\frac{2(P_{in} - P_0)}{\rho}} \cdot \mu \cdot A_*,$$

wherein, $P_0$ is an in-cylinder pressure, and $A^*$ is a total area of the nozzle.

4. The simulation method for a two-stage plunger pressurized common rail fuel system of a marine low-speed engine according to claim 1, wherein in step (3), the connecting input and output parameters of the established models to realize data transfer between the models specifically comprises:

applying $$Q_{out} = v(0) \cdot \frac{\pi \cdot d_{hp}^2}{4}$$

to calculate a fuel pressure change $\Delta P_y$, to obtain a real-time fuel pressure in the booster chamber:

$$P_y = P_{y0} + \Delta P_y;$$

applying $$Q_{in} = v(L) \cdot \frac{\pi \cdot d_{hp}^2}{4}$$

to calculate a fuel pressure change $\Delta P_f$, to obtain a real-time fuel pressure in the fuel sump:

$$P_f = P_{f0} + \Delta P_f;$$

calculating real-time pressure changes and pressures of fuel flowing through each part of the fuel system in one step $N_t$, and obtaining an injection pressure at this step; performing an iterative calculation on the fuel system model in $N_T/N_t$ steps based on the status parameters in a previous step, to obtain injection pressure data for an entire working process of the fuel system.

* * * * *